United States Patent [19]
Boitnott et al.

[11] Patent Number: 5,167,716
[45] Date of Patent: Dec. 1, 1992

[54] METHOD AND APPARATUS FOR BATCH PROCESSING A SEMICONDUCTOR WAFER

[75] Inventors: Charles A. Boitnott, Half Moon Bay; Monte M. Toole, San Carlos, both of Calif.

[73] Assignee: GaSonics, Inc., San Jose, Calif.

[21] Appl. No.: 590,402

[22] Filed: Sep. 28, 1990

[51] Int. Cl.⁵ .............................................. C23C 16/00
[52] U.S. Cl. ................... 118/719; 118/715; 118/724; 118/725
[58] Field of Search ................. 118/715, 719, 725, 724

[56] References Cited

U.S. PATENT DOCUMENTS

| | | | |
|---|---|---|---|
| 4,167,915 | 9/1979 | Toole | 118/724 |
| 4,268,538 | 5/1981 | Toole | 427/255.3 |
| 4,315,479 | 2/1982 | Toole | 118/719 |
| 4,599,247 | 7/1986 | Bean | 427/255.3 |

Primary Examiner—Richard Bueker
Attorney, Agent, or Firm—Townsend and Townsend

[57] ABSTRACT

A method and apparatus for growing semiconductor quality oxide thermal layers on semiconductor wafers fast enough to be economically feasible as a batch wafer process system. Process speed is insured by high pressure and high temperature. For example, if the pressure is about 10 to 25 atmospheres and at a temperature of 600° C. to 1100° C., approximately 90.0 minutes are required to grow a 5,000 Å oxide layer on about 50 wafers in a steam environment. The system can reach these operating conditions from ambient in approximately 17 minutes and depressurization and cool down require approximately 22 minutes. The apparatus includes a processing chamber to be pressurized with an oxidant, such as high pressure steam or oxygen. The process chamber is contained in a pressure vessel adapted to be pressurized with an inert gas, such as nitrogen, to a high pressure. A pressure control scheme is used to keep the fluid pressure of the process chamber slightly less than the pressure of the fluid pressure vessel. The pressure control permits the use of thin walls of quartz for defining the process chamber.

25 Claims, 16 Drawing Sheets

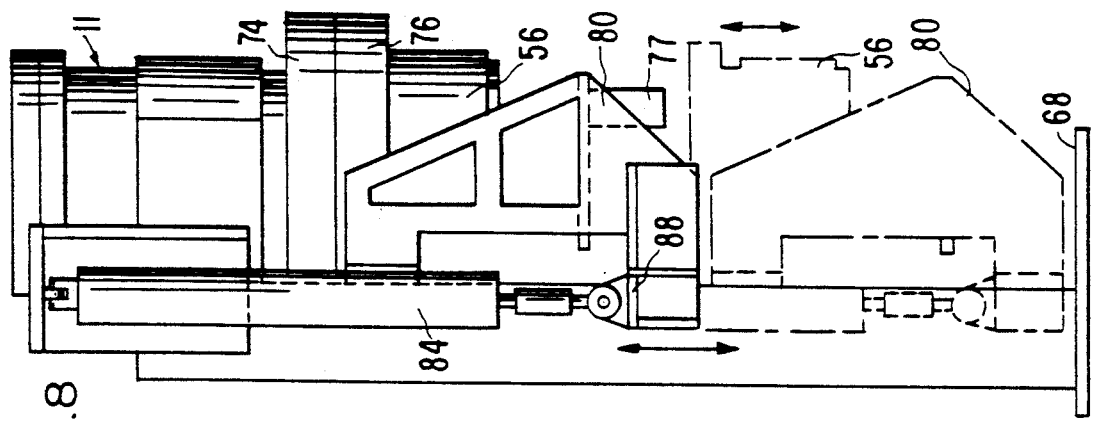
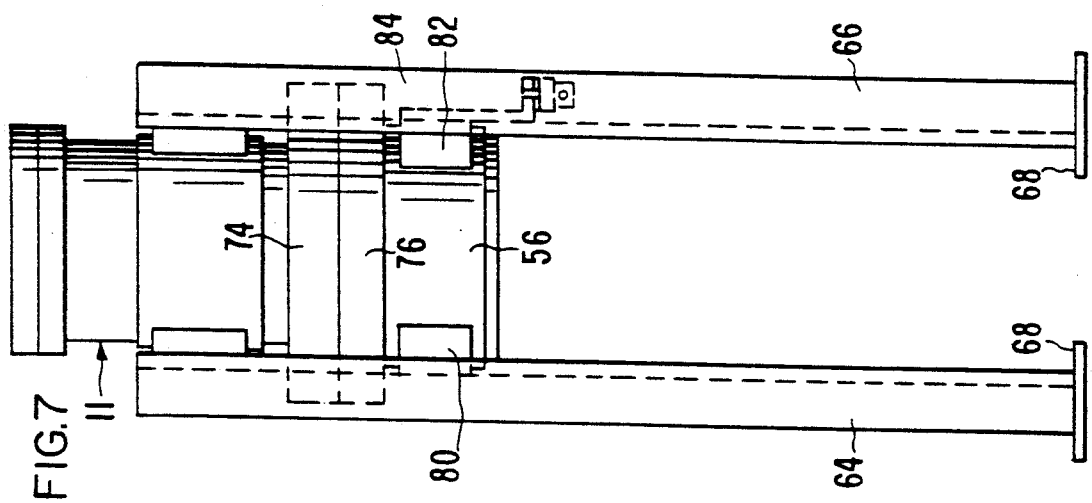
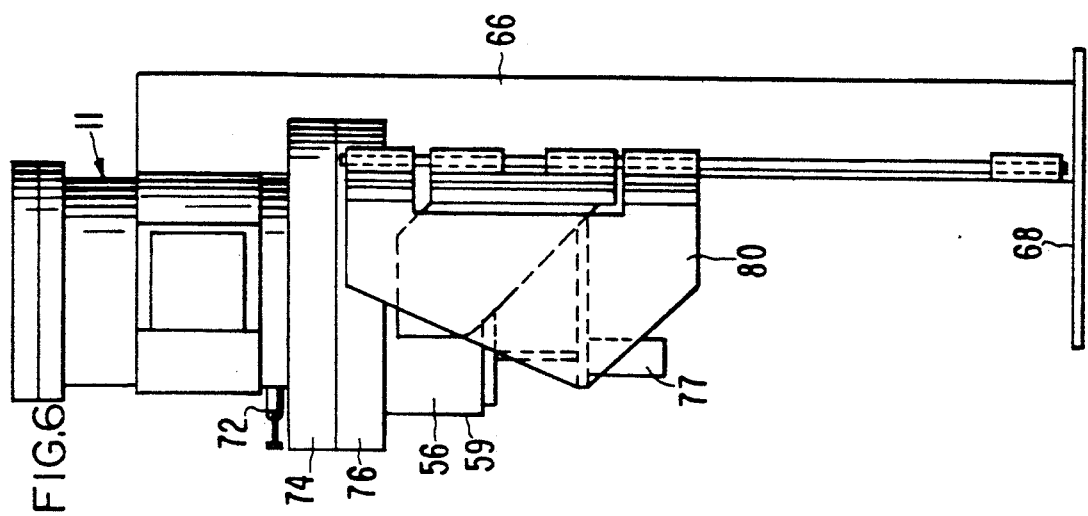

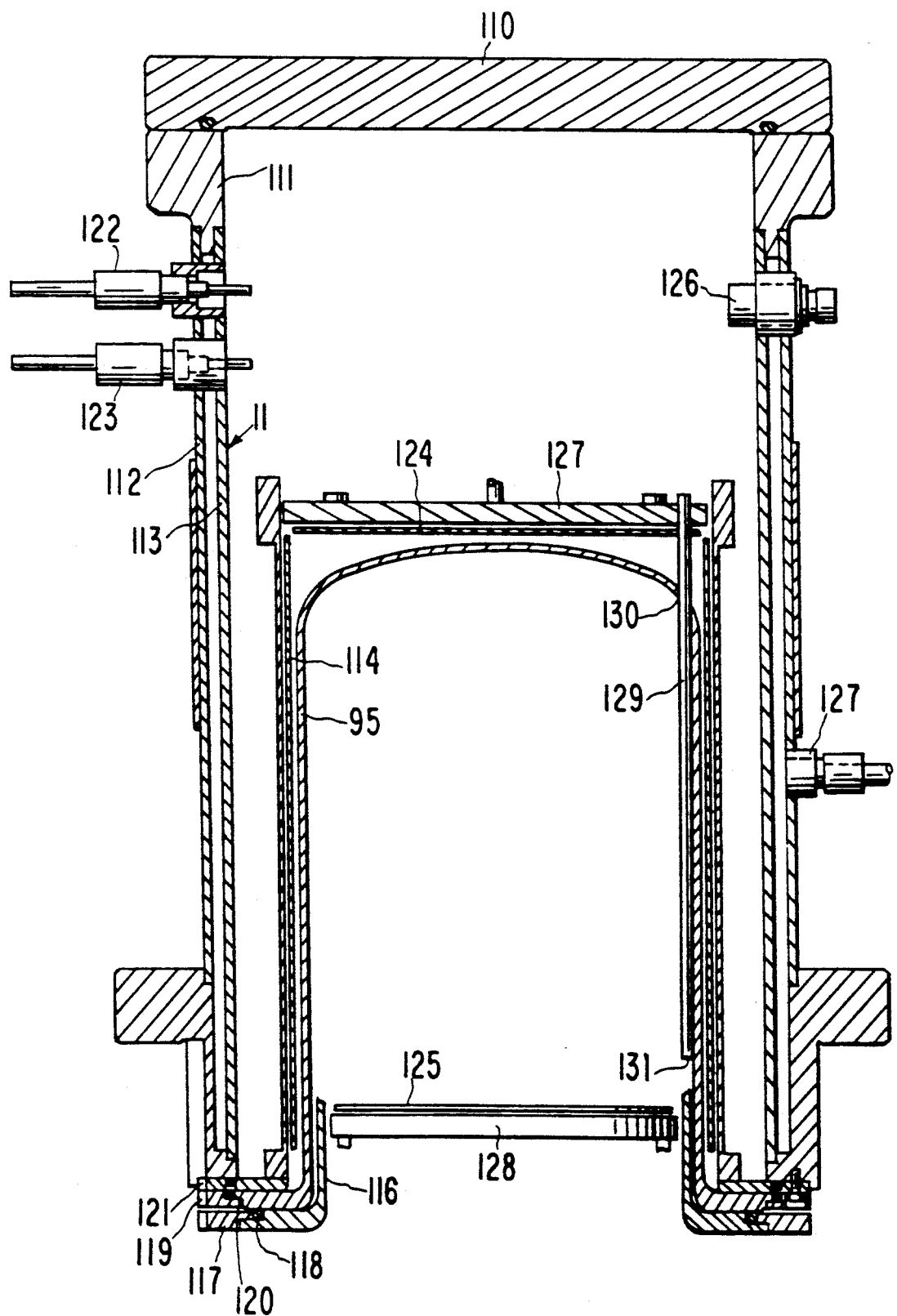

METHOD AND APPARATUS FOR BATCH PROCESSING A SEMICONDUCTOR WAFER

This invention relates to improvements in the processing of semiconductor wafers and, more particularly, to a method and apparatus for the batch processing of a semiconductor wafer at a relatively high rate.

BACKGROUND OF THE INVENTION

The use of steam and fluid pressure to grow oxides on semiconductor wafers is well known and has been used extensively in the past. Typical temperatures of steam for this purpose are about 900° to 1,000° C., and fluid pressures are about 10 to 25 atmospheres. At these operating conditions, wafers in a batch can be processed at a moderate rate, such as less than 2 hours, an acceptable time period for profitable yield. Batch processing thus gives a high throughput while providing for acceptable process conditions.

Due to improved vertical holders or towers for semiconductor wafers, batch processing of wafers is being done in an expeditious manner. The reasons for this batch wafer trend includes greater control of the wafers in the tower, the relatively high cost of the wafers, and the relatively large size of the wafers. Moreover, with greater wafer control and when the wafers are in a batch, the possibility of wafer damage or breakage is minimized. Furthermore, the sizes of wafers are increasing. Typically, 6" wafers are now being used, and it is foreseeable that 8" and 12" wafers will be used in the future. Because of the problems associated with conventional techniques of batch processing, a need exists for improvements in the batch processing of semiconductor wafers so that such processing can be more economically feasible. The present invention satisfies this need.

Disclosures relating to the field of the present invention include U.S. Pat. Nos. 4,167,915, 4,268,538, 4,315,479 and 4,599,247. The method and apparatus to be described herein are improvements over the single wafer processing apparatus and method disclosed in U.S. patent application Ser. No. 311,686, filed Feb. 15, 1989.

SUMMARY OF THE INVENTION

The present invention is directed to a method and apparatus for growing semiconductor quality, oxide thermal layers on semiconductor wafers fast enough to be economically feasible as a batch wafer process system. All aspects of the present invention cooperate for achieving acceptable process conditions while providing reasonable wafer throughput.

Process speed is insured by high pressure and high temperature. For example, if the pressure is about 10 atmospheres (150 psi) and at a temperature of 850° C., a time interval of approximately 7.0 minutes is required to grow a 1,500 Å oxide layer on a wafer in a steam environment. The system can reach these operating conditions from ambient in approximately 27 minutes, and depressurization and cool-down require approximately 42 minutes.

The apparatus of the present invention comprises a unique process chamber in a pressure vessel loaded from the bottom, and the wafers are fed into the bottom of the process chamber under clean room conditions. The process chamber is adapted to be pressurized with an oxidant, such as high pressure steam or dry oxygen. The pressure vessel is adapted to be pressurized with an inert gas, such as nitrogen, to a high pressure.

Another unique feature of the present invention is the use of a pressure control scheme which keeps the pressure vessel at a small positive pressure, such as 1 psi, relative to the pressure of the process chamber to insure hermetic integrity and cleanliness. The pressure control allows the apparatus of the present invention to be highly flexible, and capable of a wide range of operating conditions, such as from vacuum to high pressures, such as 25 atmospheres and higher, and at temperatures ranging up to 900° C. and higher.

To obtain the required process rate and purity using the present invention, semiconductor wafers in a quartz tower or holder are placed in the process chamber in the pressure vessel, following which the process chamber is closed and pressurized with an oxidant, such as steam or dry oxygen. Heaters outside the process chamber are used to heat the interior of the process chamber. The steam is created and pressure is ramped at a certain rate, such as 30 psi per minute. Since the walls of the process chamber must be relatively thin to minimize thermal cool-down, preventing breakage of the process chamber walls due to fluid pressure differential requires a unique chamber-vessel separation scheme which includes pressure equalization. Control of the fluid pressure in the process chamber and the pressure vessel is done electronically using pressure sensors and fluid valves.

Steam is generated within a unique boiler at the upper end of and outside of the process chamber and within the pressure vessel. Steam flows into, through and out of the process chamber, and the steam exhausts through an exhaust tube which can form a part of the pressure equalization scheme.

The primary object of the present invention is to provide an improved method and apparatus for batch processing semiconductor wafers, wherein the process includes bottom loading of semiconductor wafers in a process chamber, and the process is highly flexible and suitable for applying oxides to a plurality of wafers at a high throughput while achieving optimum process conditions.

Other objects of this invention will become apparent as the following specification progresses, reference being had to the accompanying drawings for an illustration of an embodiment of the invention.

BRIEF DESCRIPTION OF THE DRAWINGS

FIG. 6 is an elevational view of one side of the pressure vessel containing the process chamber with the bottom of the pressure vessel being closed;

FIG. 7 is a rear elevational view of the combination of elements of FIG. 6;

FIG. 8 is an elevational view of the opposite side of the pressure vessel with the lower closure of the pressure vessel being shown in dash lines in a lowered condition;

FIG. 10 is a vertical section through the process chamber in the pressure vessel, the process chamber being formed by a bell jar of inert material, such as quartz, surrounded by heaters for heating a tower of semiconductor wafers to be placed into the bell jar;

DETAILED DESCRIPTION OF THE DRAWINGS

Figure 1:
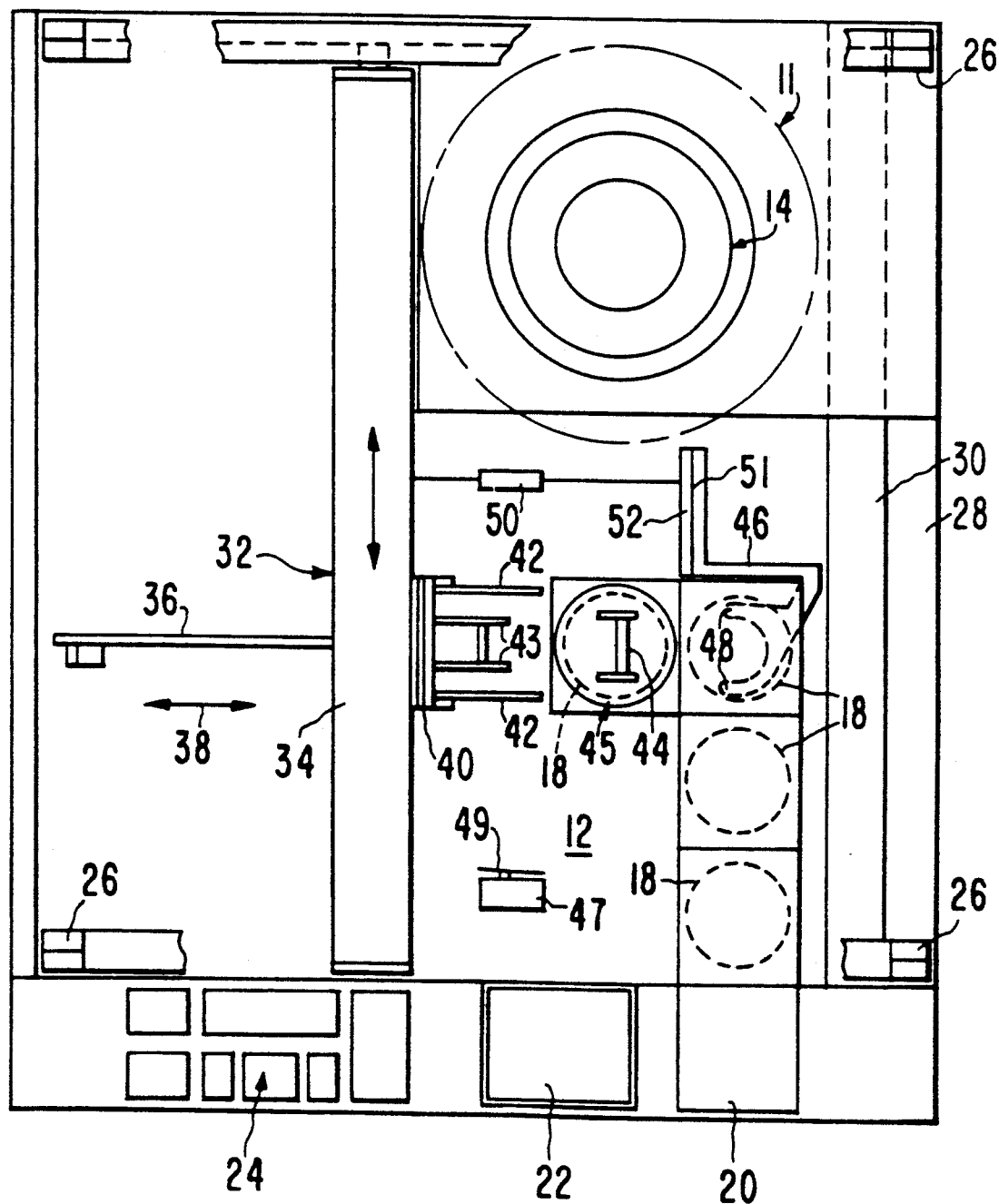
FIG. 1 is a top plan view, schematic in form and showing the xyz moving system for semiconductor wafers for placement in a process chamber within a pressure vessel.

The apparatus for the batch processing of semiconductor wafers is broadly denoted by the numeral 10 and includes means defining a closed compartment 12 for housing pressure vessel means 11 containing process chamber means 14. A plurality of cassettes or boats 16 (FIGS. 2-5) which include stacks of semiconductor wafers 18 which are moved in cassettes 16 into compartment 12 through an access opening 20 adjacent to a video display 22 and a control panel 24 for use in moving the cassettes 16 about in compartment 12.

The means defining closed compartment 12 include corner posts 26 which have panels associated with them to present plenum chambers 28 and Hepa filters 30. Thus, compartment 12 can be provided with clean room characteristics of the highest quality.

An xyz moving unit 32 is located in compartment 12 adjacent to pressure vessel means 11 shown in FIG. 1. The x part 34 of unit 32 moves the cassettes 16 along the length of part 34 in an x direction, in the direction of arrows 35. A y part 36 moves the x part 34 in a y direction, in the direction of arrows 38, and a z part 40 is movable upwardly and downwardly and has a pair of horizontal legs 43 which are to be placed through the handle 44 of a quartz tower 45, the tower being adapted to support a plurality of vertically spaced semiconductor wafers to be processed which move with the tower into process chamber means 14 through the bottom thereof.

A shiftable arm 46 has a pair of spaced fingers 48 (FIG. 1) and arm 46 is coupled with control means 50 coupled with unit 32 whereby the operation of parts 34, 36 and 40 of xyz unit 32 operate to move the arm 46 relative to the cassette 16. The fingers 48 of arm 46 also support a semiconductor wafer 18, as the wafer is moved from a cassette 16 toward and into tower 45 in preparation for filling the tower with wafers to be processed. Another control means 47 is provided in compartment 12 for centering each wafer 18 on a turntable 49 (FIG. 1) so that the wafer will be properly oriented relative to tower 45 as the wafer is being moved by arm 46 into a respective horizontal position in tower 45. This centering of the wafer avoids scraping the edge of the wafer on the tower during insertion of the wafer, thereby avoiding the formation of particles which would contaminate the atmosphere surrounding the wafer.

Means 50 also operates to rotate the arm 46 about the central axis 51 of an elongated shaft-like element 52 coupled with arm 46. The purpose of rotating the arm 46 is to move the arm out of tight places near the tower 45 when semiconductor wafers 18 are moved into and out of the tower 45 before and after processing of the wafers in the process chamber means 14.

Figure 2:
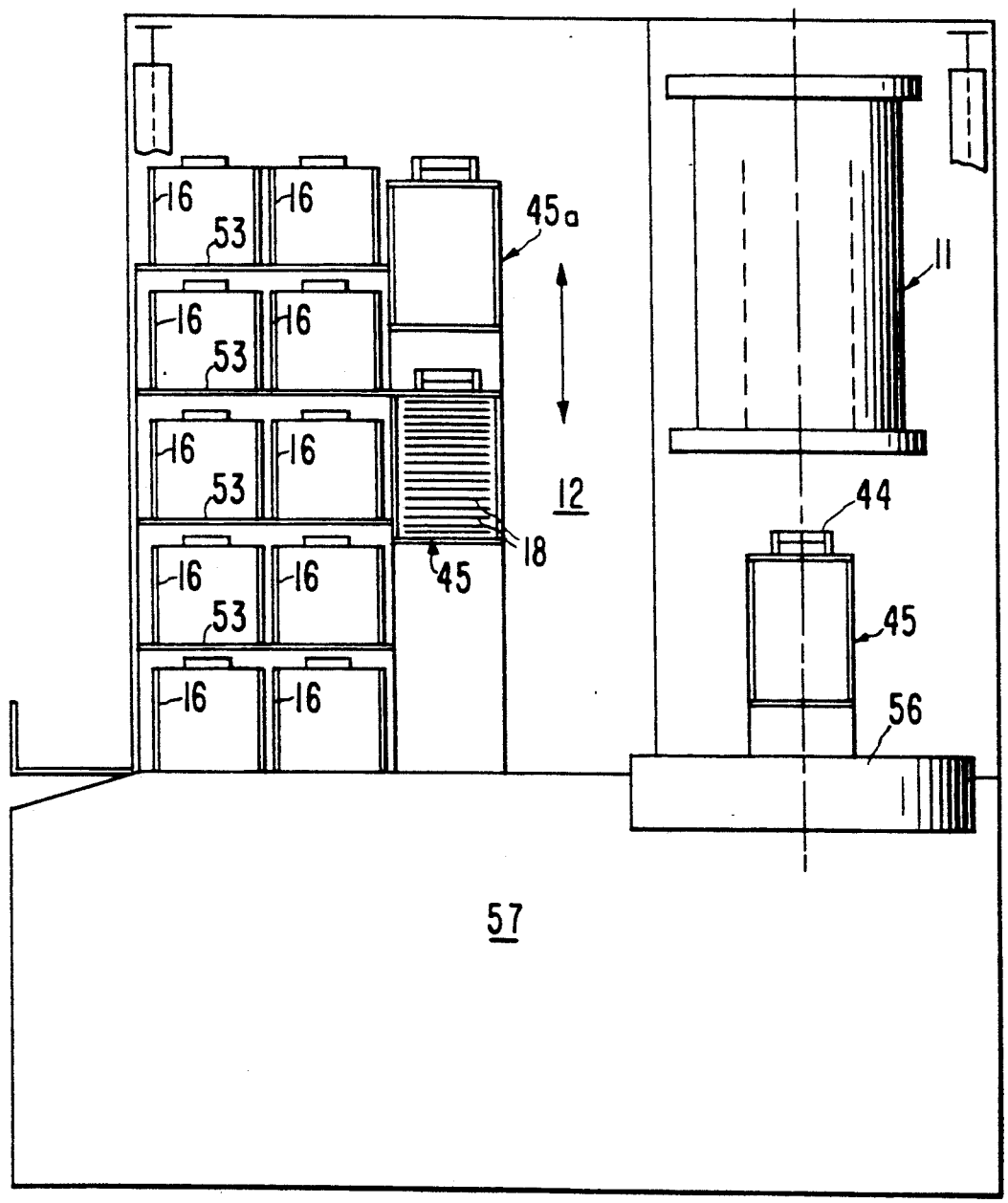
FIG. 2 is a side elevational view, generally schematic in form, of the combination of elements of FIG. 1, showing the vertical tower containing semiconductor wafers to be processed in a bottom loading process chamber.

FIG. 2 shows compartment 12 with cassettes 16 containing semiconductor wafers 18 to be processed, the cassettes being supported on shelves 53 adjacent to one side 55 of the housing defining the compartment 12. The cassettes 16 are also adjacent to tower 45 containing semiconductor wafers 18 which are to be placed on the bottom closure 56 as shown in FIG. 2, the tower being denoted by numeral 45 and handle 44 is at the upper end of the tower. A second tower 45a is above tower 45 and in a position for cooling the wafers 18 after the wafers have been processed and moved removed from the process chamber means 14.

The lower space 57 (FIG. 2) below the cassettes 16 and below the bottom 56 of process chamber means 14 contain the air moving means and the power supply means required to operate the various components of apparatus 10. The entrance gate 20 for passing the cassettes 16 into compartment 12 is shown in FIG. 2 in horizontal alignment with the bottom row of cassettes 16, the xyz unit 72 not being shown in FIG. 2 to simplify the drawing.

Figure 3:
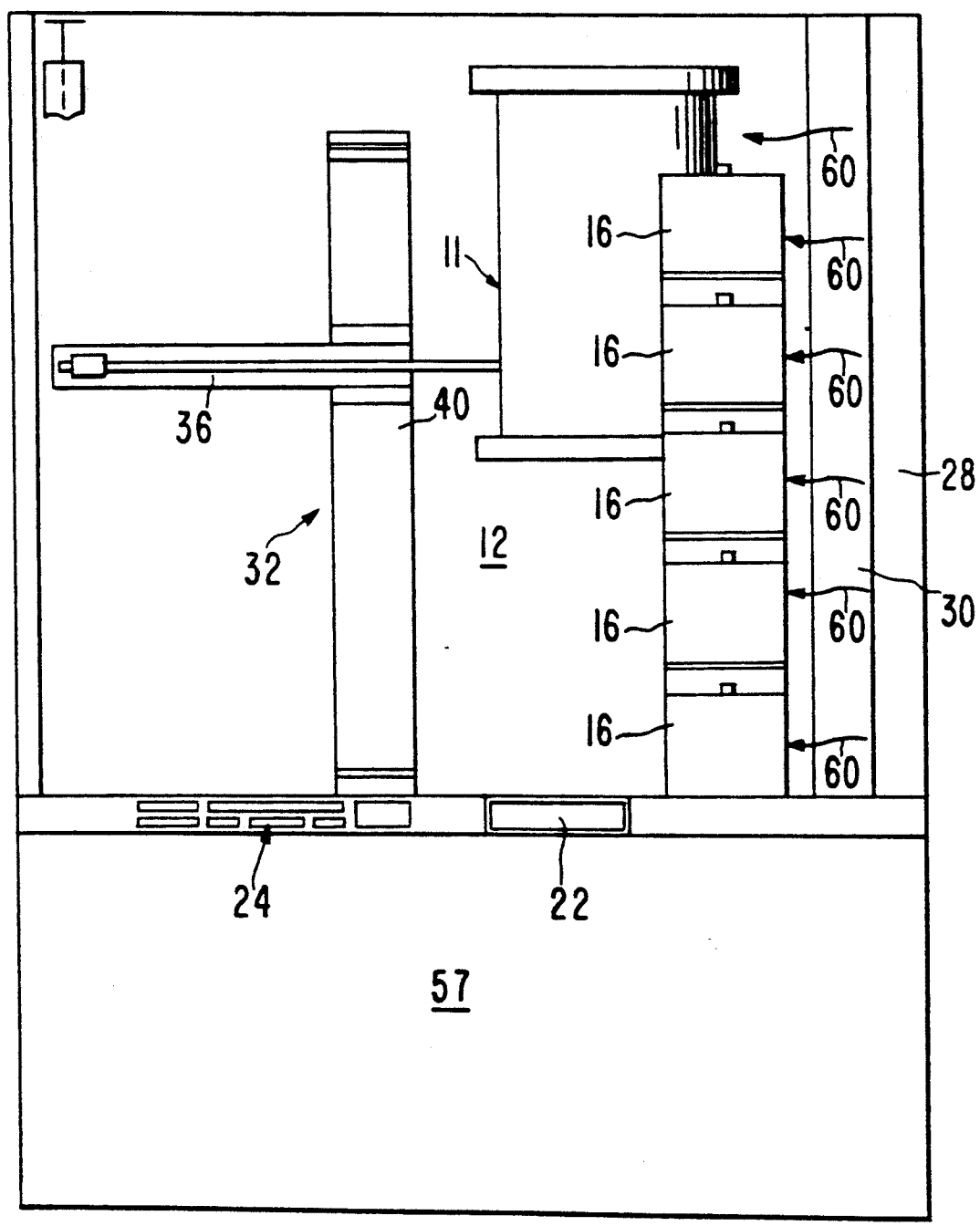
FIG. 3 is a view similar to FIG. 2 but showing the clean air flow from a plenum past the wafers in cassettes stacked adjacent to the process chamber in a clean room compartment and in the path of the air flow of the clean room atmosphere in which the process chamber is located.

XYZ unit 32 is shown in FIG. 3 adjacent to pressure vessel 11 and removed from a vertical stack of cassettes 16 for semiconductor wafers 18 to be processed in process chamber means 14. The air flow from plenum 28 through a Hepa filter 30 is indicated by air flow arrows 60 toward and through the cassettes 16 to provide for the clean room characteristics of compartment 12 at all times.

Figure 4:
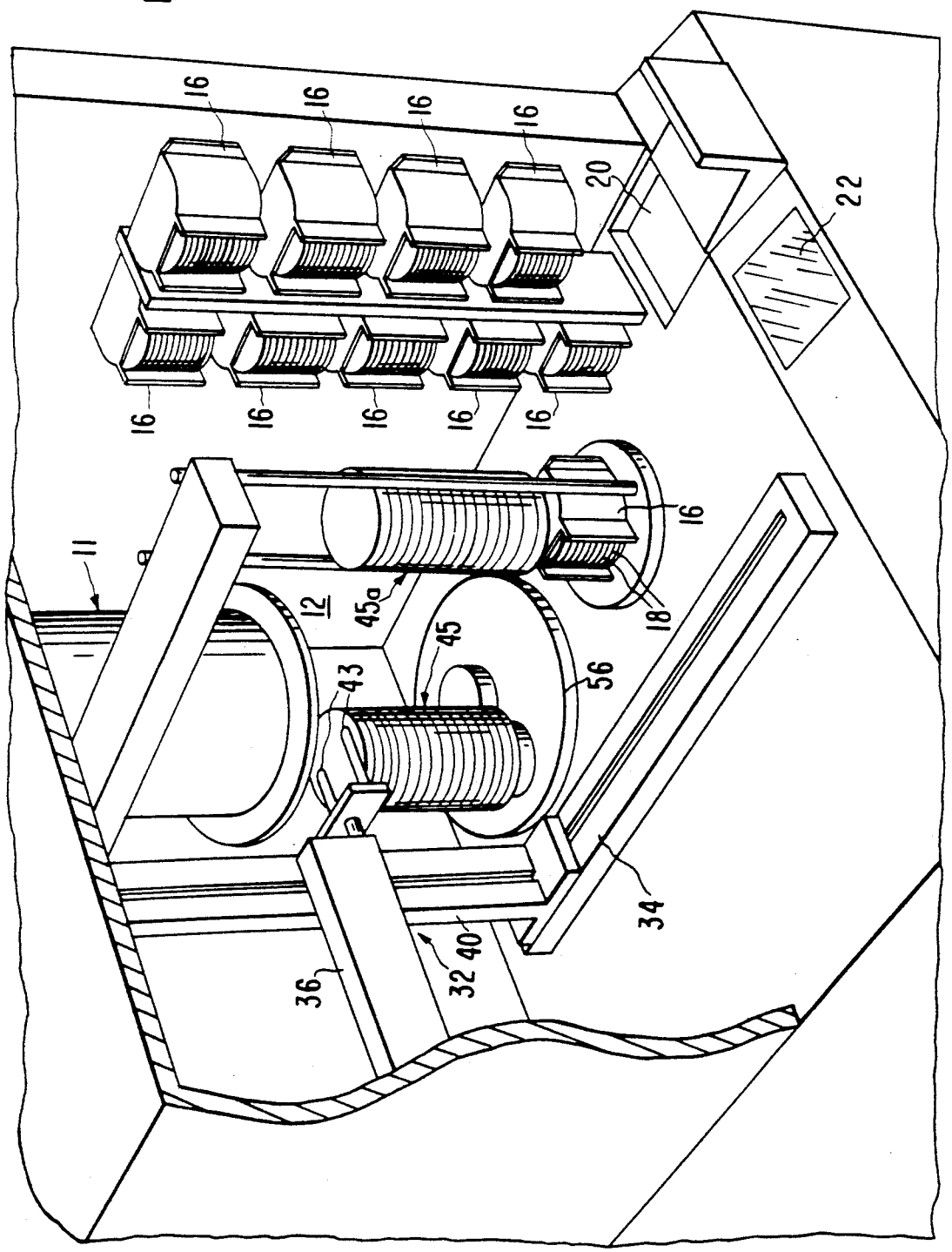
FIG. 4 is a perspective view, partly broken away and in section, showing the process chamber and a tower of semiconductor wafers about to be elevated into the process chamber as another tower of semiconductor wafers is being cooled.

FIG. 4 is a view showing the pressure vessel means 11 open with the bottom closure 56 in a lowered condition and a first tower 45 of semiconductor wafers 18 being supported on closure 56 before the closure is elevated into a position closing the bottom of pressure vessel means 11. FIG. 4 also shows a pair of fingers 43 forming parts of xyz unit 32 and adapted to be inserted into the handle 44 (FIGS. 1-3) of wafer tower 45 to facilitate the movement of the tower onto and off the center pedestal 56a of closure 56. The other wafer tower being denoted by numeral 45a and being above a cassette 16 of semiconductor wafers 18 which are to be taken one by one out of the cassette and placed into tower 45a. Other cassettes 16 are shown schematically in FIG. 4 in standby positions, waiting movement by the xyz means 32 in the positions, such as the position shown below tower 45a so that the semiconductor wafers 18 from the standby cassettes 16 can be transferred into positions in tower 45a. FIG. 4 also shows the access opening 20 by means of which cassettes 16 can be moved into compartment 12 and into the standby position shown in FIG. 4.

Figure 5:
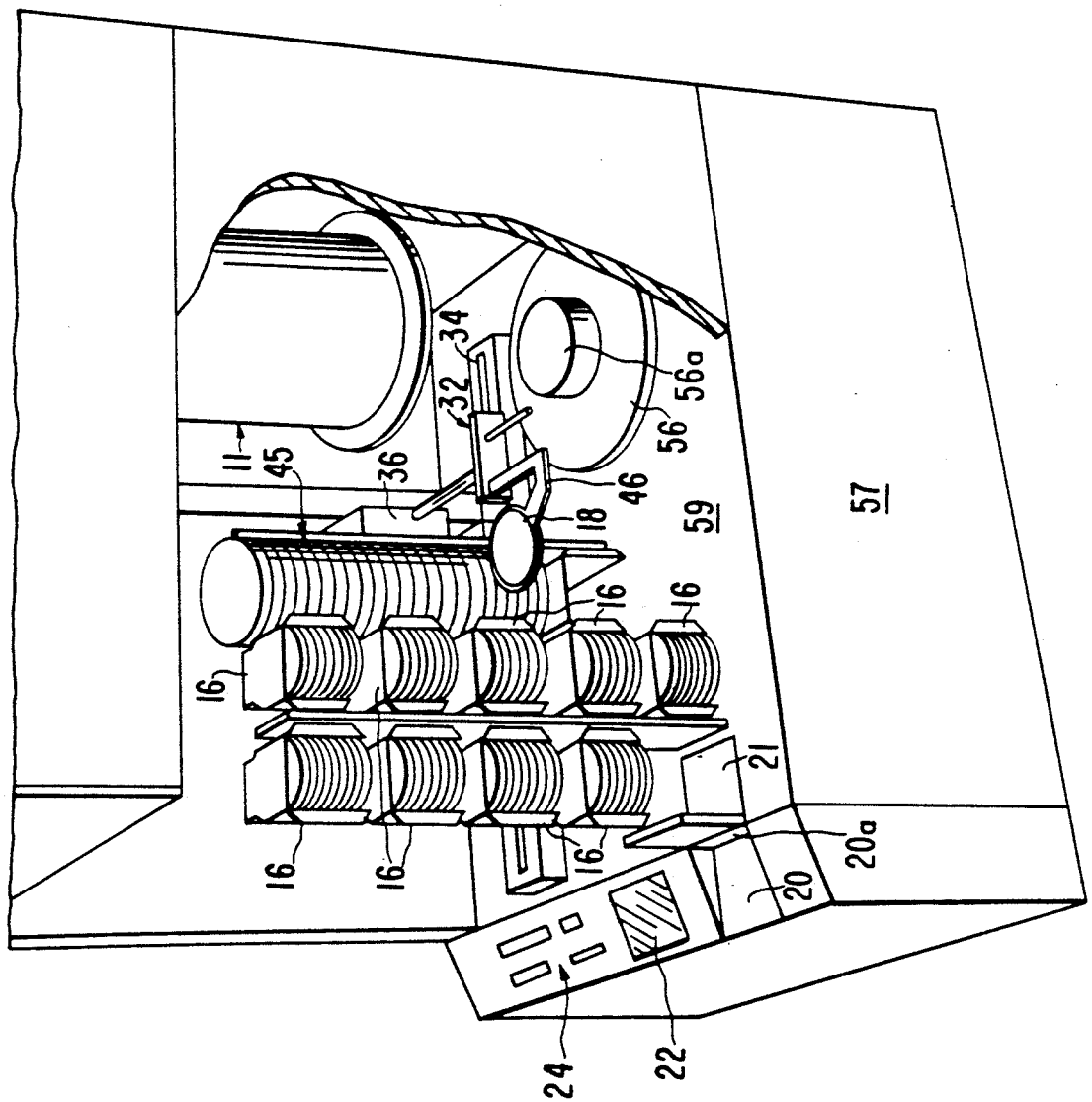
FIG. 5 is a view similar to FIG. 4 but showing another aspect view of the interior of the clean room compartment in which the cassettes of semiconductor wafers and the process chambers are located, the bottom of the process chamber being open.

FIG. 5 shows the entrance opening 20 adjacent to the access opening 21 by means of which cassettes 16 of semiconductor wafers 18 can be moved into compartment 12. FIG. 5 also shows the pressure vessel means 11 as being open with the closure 56 thereof lowered into a position adjacent to the bottom surface 59 of the compartment.

FIG. 5 clearly shows arm 46 carried by xyz unit 32 and the arm is shown transferring a semiconductor wafer 18 from a cassette 16 to tower 45. Spinning means 47, 48 (FIG. 1) is provided for each wafer 18, respectively, so that when the wafer is positioned by arm 46 in the corresponding tower 45, the wafer will be properly centered so that the wafer will not scrape the tower walls and generate particles. Also, arm 46 has an optical device 46a (FIG. 1) to optically find the slots of the tower 45 to avoid scraping of the wafer during insertion.

Pressure vessel means 11 is carried on the upper ends of a pair of spaced, generally vertical posts 64 and 66 (FIG. 7), posts 64 and 66 being mounted on feet 68 for attachment to the bottom surface of the housing containing compartment 12.

Closure 56 comprises a cylindrical member 59 which supports tower 45 at the upper end of the vessel and which is coupled by a bayonet connection 70 (FIGS. 6 and 7), on the upper marginal edge of closure 56. A fluid piston and cylinder assembly 72 (FIG. 6) is adapted to engage and to be connected at one end thereof to the ring joint 74. The opposite end of assembly 72 is connected to one of the posts 64 and 66. Joint 74 has a lower joint member 76 provided with bayonet connection means 70 thereon. Once the closure 56 is in the elevated position shown in FIGS. 6-8, device 72 is energized to rotate ring joint 74 relative to closure 56 so that the bayonet connection 70 will connect closure 56 and joint 74 together, thereby closing and sealing closure 56 to the lower ring of ring joint 74. Before this occurs, the tower 45 of semiconductor wafers 18 will be moved into a bell jar defining process chamber means 14 by the actuation of one or more fluid actuated power devices 77 (FIGS. 6 and 8). Actuation of device 77 also forces a pair of fluid seals into engagement with each other, these seals being shown in FIGS. 10 and 18 and described hereinafter. When tower 45 is supported in reaction chamber means 14, steam and a gas under pressure, such as nitrogen, will be charged into the pressure vessel and the process chamber means, respectively, for effecting the processing of the semiconductor wafers in the tower within the process chamber means.

A pair of side supports 80 and 82 are coupled (FIGS. 6-8) with closure 56 on opposite sides hereof. Supports 80 and 82 are slidably coupled to posts 64 and 66 so that the supports can move up and down to thereby move closure 56 upwardly and downwardly.

A fluid piston cylinder assembly 84 (FIGS. 7 and 8) is coupled at its upper end to a fixed support 86 and at its lower end to a bracket 88 on one of the supports 80 and 82. Piston and cylinder assembly 84 is used to elevate supports 80 and 82 from the dashed line position of FIG. 8 to the full line position. Closure 56 is moved from the dashed line position of FIG. 8, to the full line position closing the lower end of the process chamber and pressure vessel 11. Means (not shown) is provided to supply a fluid under pressure to the cylinder of device 84 to thereby activate the same and draw the piston upwardly to thereby raise closure member 56 to the full line position thereof shown in FIG. 8. To lower closure 56 relative to the pressure vessel 11, the fluid is allowed to bleed by gravity from the cylinder of device 84, thereby permitting lowering of closure 56 so that there is no need for driving the same downwardly under the influence of a drive fluid exerted on the upper end of the piston of element 84.

Figure 9:
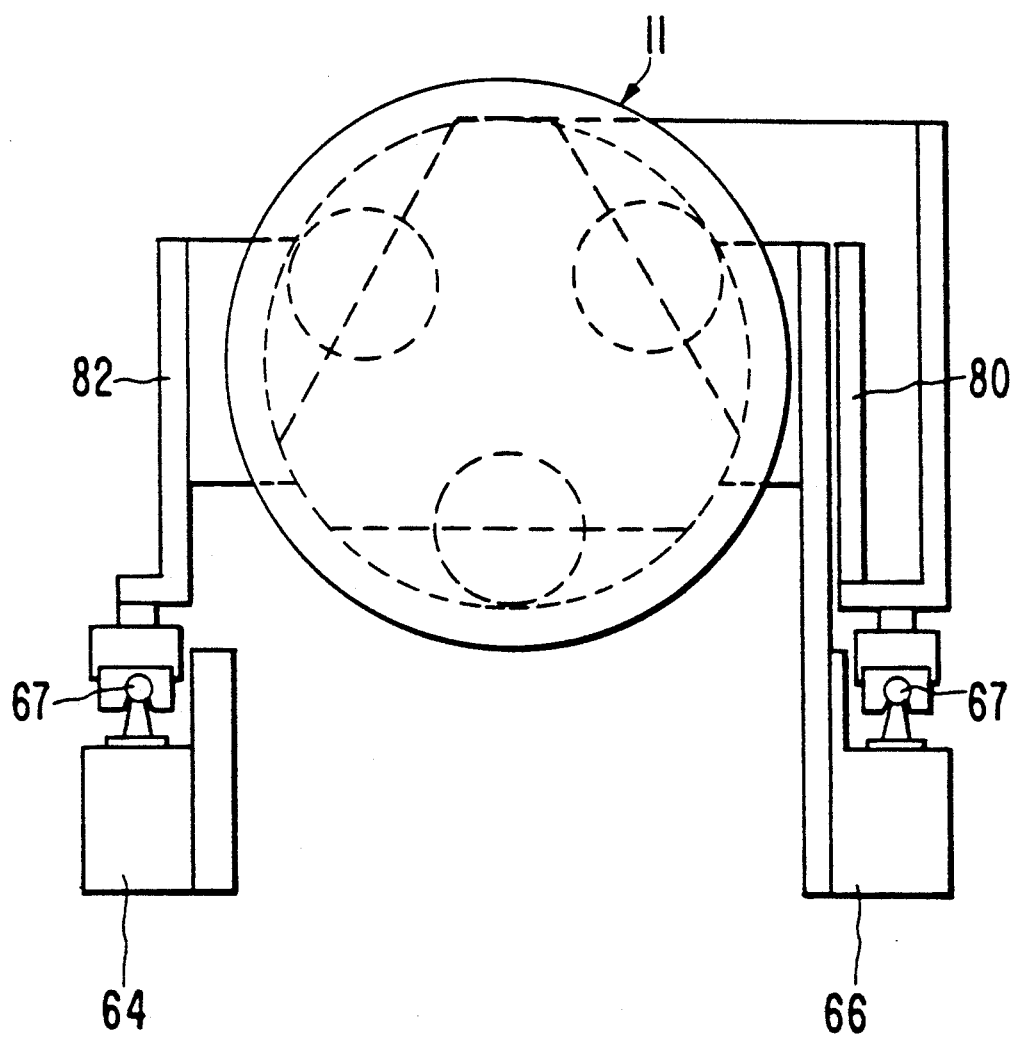
FIG. 9 is a top plan view of the pressure vessel of FIGS. 6-8.

FIG. 9 shows pressure vessel means 11 with posts 64 and 66 on opposed sides thereof, each post having a track 67 for guiding the supports 80 and 82 upwardly and downwardly to thereby raise and lower, respectively, the closure 56 relative to pressure vessel 11.

Figure 9A:
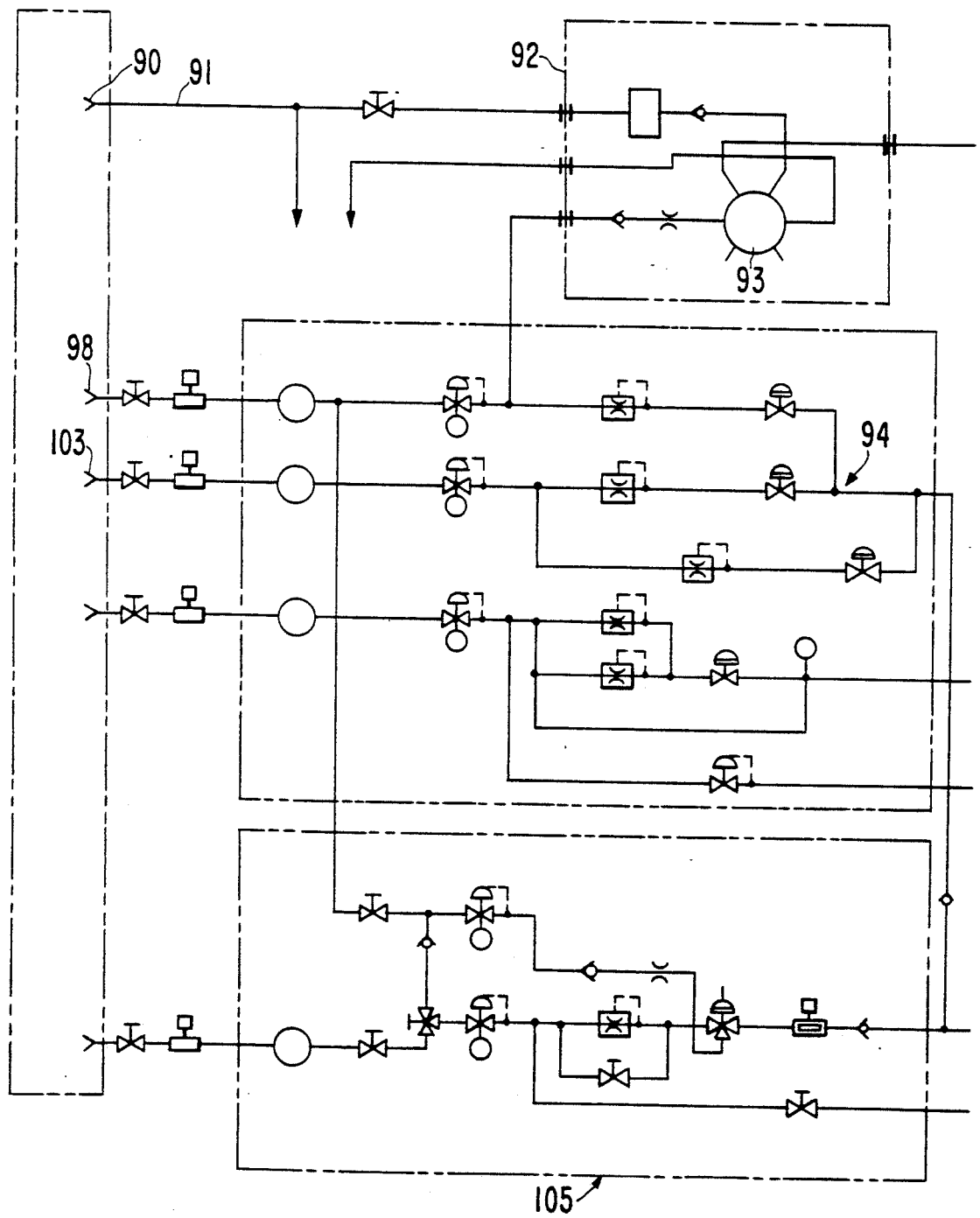
FIGS. 9A and 9B are schematic diagrams of the fluid operating system of the apparatus of the present invention.
Figure 9B:
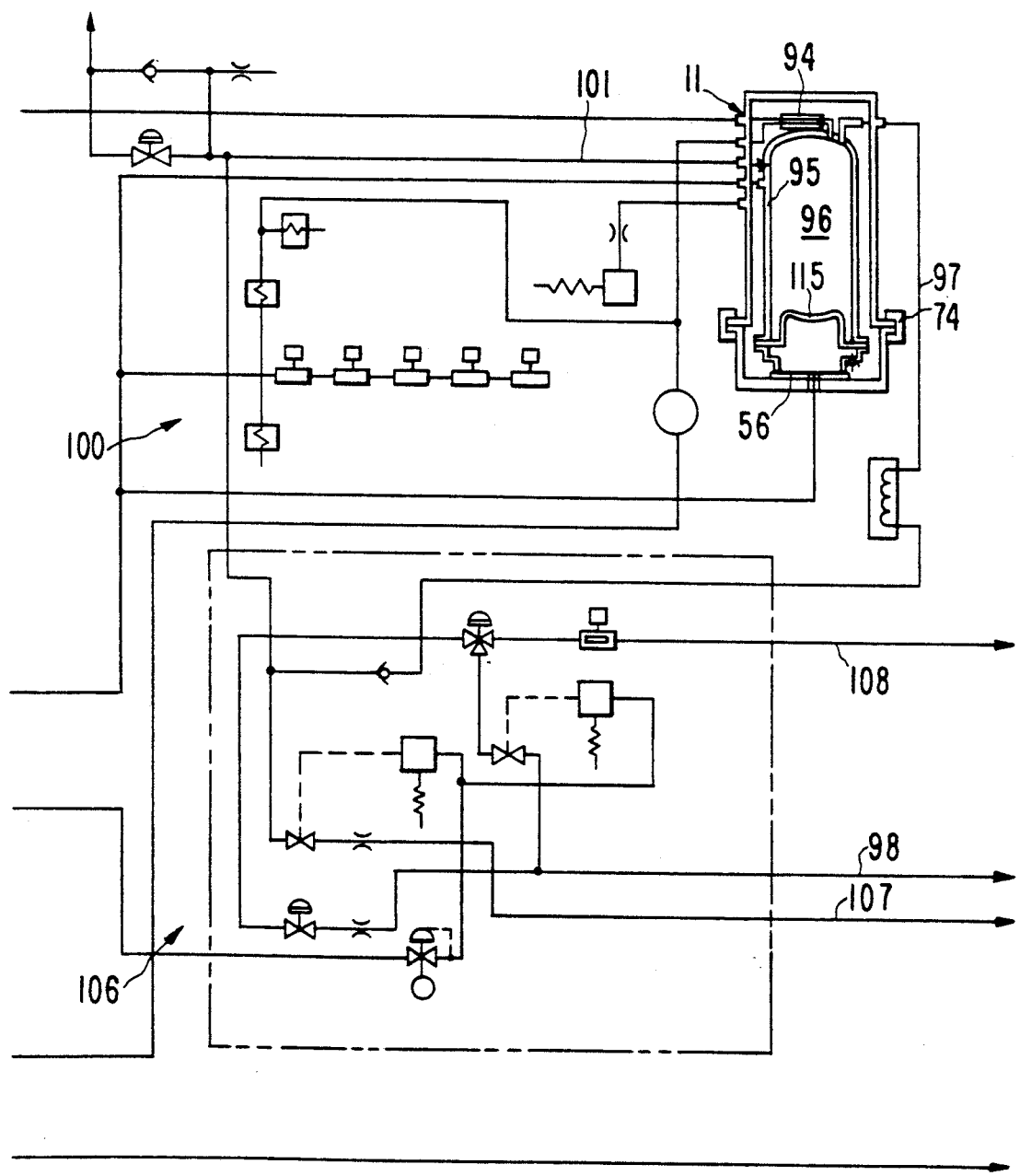

FIGS. 9A and 9B show a schematic of the fluid operating system of apparatus 10.

The fluid system of FIGS. 9A and 9B include a deionized water inlet 90 with a line 91 connected to a deionized water channel 92 having a valve 93 coupled to a steam generator 94 on the upper end of a bell jar 95 defining a process chamber 96 into which a tower 45 of semiconductor wafers 18 is placed. Steam from the generator entered process chamber 96 and oxidizes the semiconductor wafers in the process chamber. The steam exhaust follows a long line 97 and passes outwardly along a line 98 (FIG. 9B).

A fluid input 98 (FIG. 9A) is provided for the flow of nitrogen or other inert gas, which flows through a high pressure gas panel denoted by the numeral 99 (FIG. 9A) and then through a pressure monitor 100 (FIG. 9B) before the nitrogen reaches the pressure vessel 11 along the line 101 (FIG. 9B).

An oxygen input 103 can be provided in case oxygen is to be used as the oxidant instead of steam. A chloride-based material, such as HCL, can be provided at an input 104 to a cleaning subsystem 105 for cleaning purposes. Exhaust system 106 is provided for exhausting gasses to the atmosphere along the line 107 as desired or deemed necessary. An exhaust line 108 is provided for the HCL after it is used for cleaning purposes.

In FIG. 10, pressure vessel 11 includes a circular top 110 secured in any suitable manner to the upper end 111 of a double walled housing having walls 112 and 113 adjacent to each other for receiving a coolant therebetween. Bell jar 95 is located within pressure vessel 11 and is surrounded by a cylindrical heater means 114 so as to heat the interior of the bell jar and thereby the semiconductor wafers on the tower (FIG. 18) in the bell jar. Heater means 114 can be comprised of two or more parts which are cylindrical and which encircle the outer surface of the bell jar. Suitable electrical connections can be quickly and easily made to the heater means to supply electrical power thereto.

Figure 18:
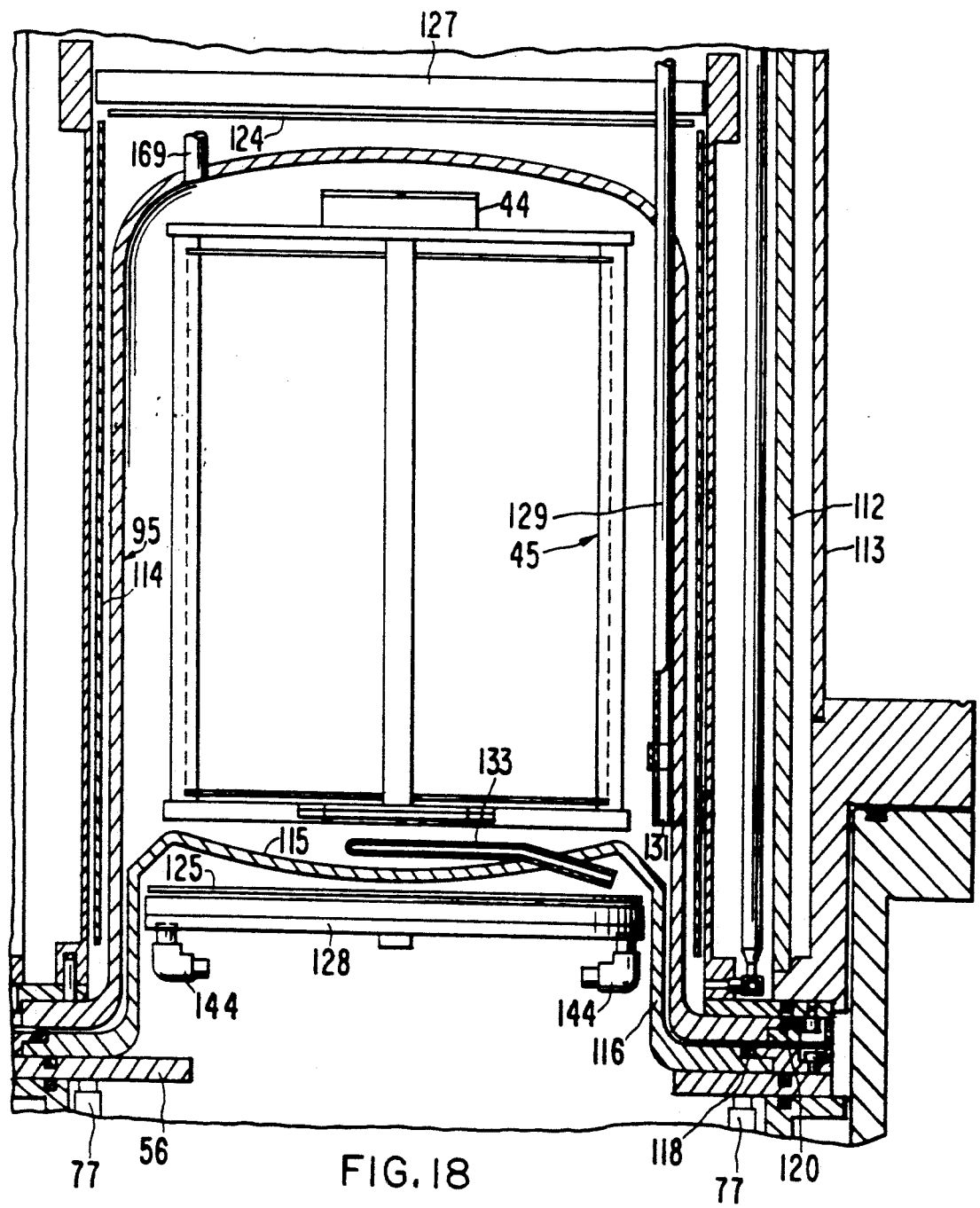
FIG. 18 is a vertical section through the process chamber and the pressure vessel, showing the tower of semiconductor wafers mounted in the bell jar and the bottom closure of the bell jar in place.

The bell jar is made of thin walled inert material, such as quartz, that has a bottom 115 (FIG. 18) which is curved as shown in FIG. 18 and which has an angular, downwardly extending part 116 (FIG. 10) and a horizontal, annular part 117 provided with an annular seal 118 engaged with the bottom surface of a flange 119 on the bottom of bell jar 95. A seal 120 engages between flange 119 and flange 121 on wall 113 of pressure vessel 11. The two flanges 117 and 119 are both of quartz and present a quartz to quartz seal by virtue of openings 118 and 120 (FIG. 10). These seals are forced into engagement with each other when power device 77 (FIGS. 6 and 8) is actuated.

Feed through connectors 122 and 123 (FIG. 10) are carried by pressure vessel 11 to provide power leads to the interior of pressure vessel 11 for energizing heaters 114 and the other heaters, such as upper planar heater 124 above the bell jar and lower planar heater 125 below bottom 56 (FIG. 18). A fluid inlet device 126 and a fluid outlet device 127 are provided to direct an inert gas, such as nitrogen, into the interior of pressure vessel 11 and around the bell jar 95.

Upper and lower chill plates 127 and 128 are provided to receive coolant, such as water, at locations directly above heater 124 and directly below heater 125, respectively (FIG. 10). Steam inlet 129 extends into the bell jar through an opening 130 (FIG. 10) and has a lower open end 131 near the bottom 115 of the bell jar as shown in FIG. 18.

Figure 11:
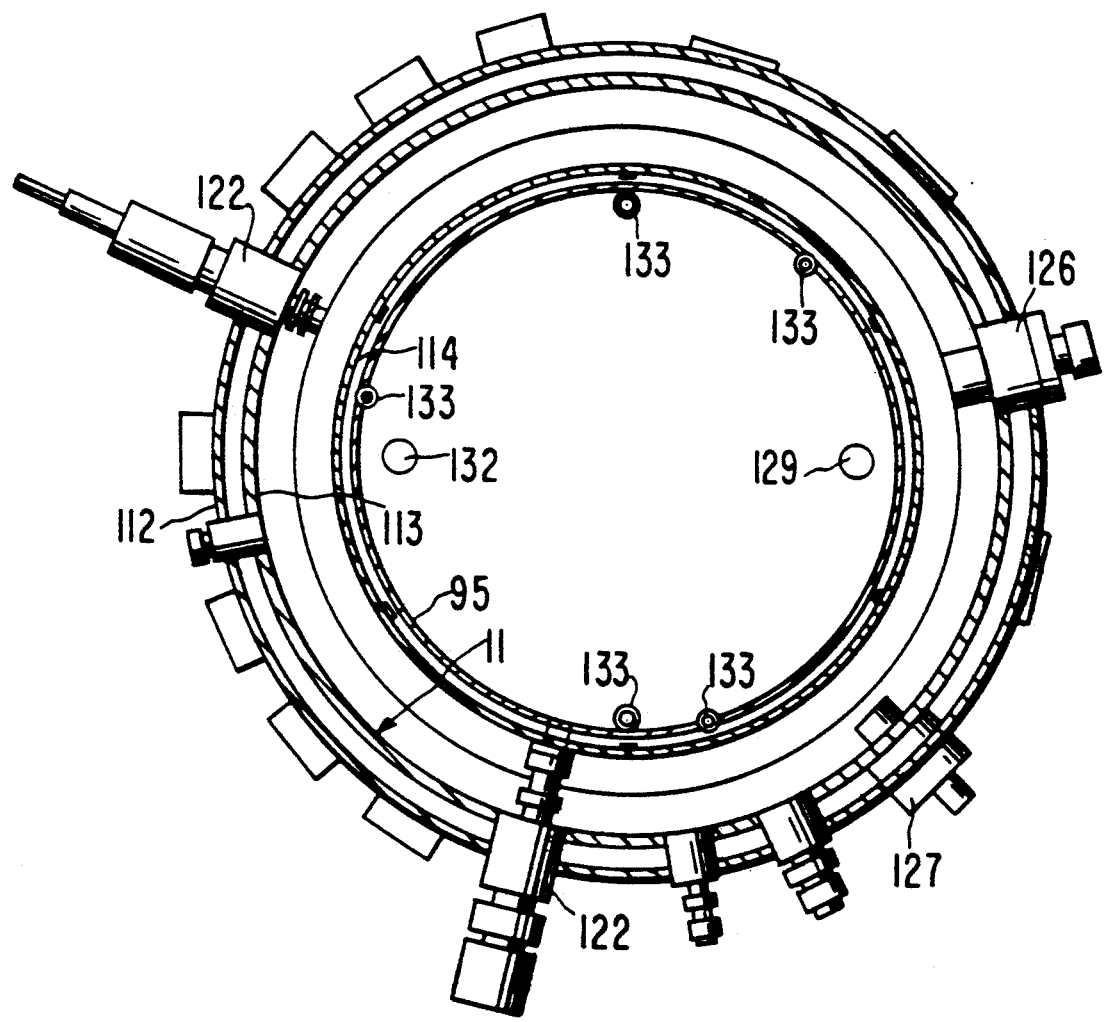
FIG. 11 is a horizontal section through the process chamber and pressure vessel of FIG. 10.

Power input connector 122 and gas inlet 126 are shown in FIG. 11 in surrounding relationship to bell jar 95 having a steam inlet 129 and a steam outlet 132. A second power lead-in unit 122 can be provided. Moreover, tubes 133 can be positioned around the outer periphery of bell jar 95 for containing thermocouples exteriorly of the bell jar for measuring the temperature in the vicinity of the outer surface of the bell jar. This temperature measurement provides a measure of the temperature of the steam or oxygen in the interior of the bell jar.

Figure 12:
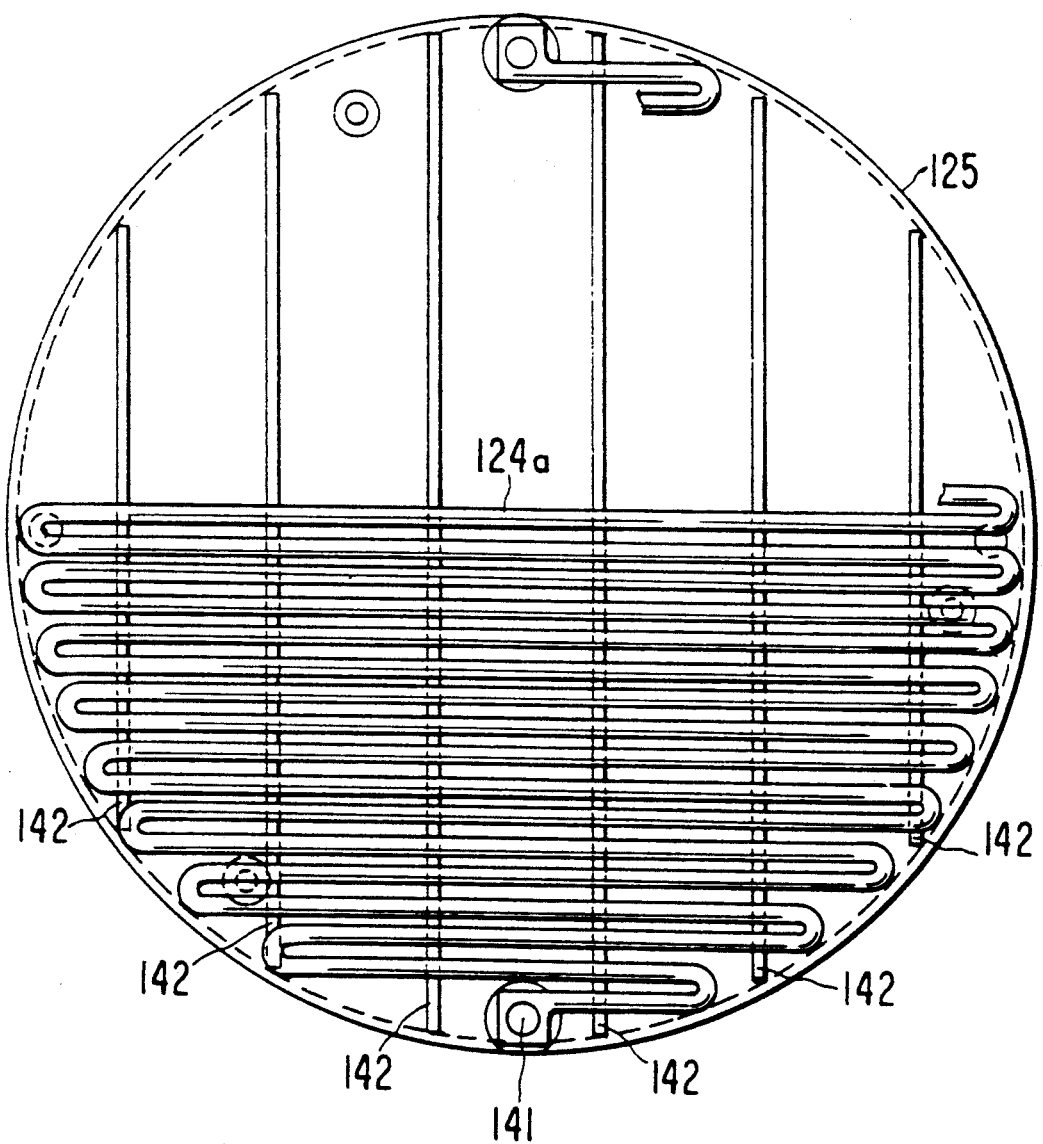
FIG. 12 is a plan view of a planar graphite heater placed at the upper or lower end of the bell jar for heating the semiconductor wafers in the bell jar.
Figure 13:
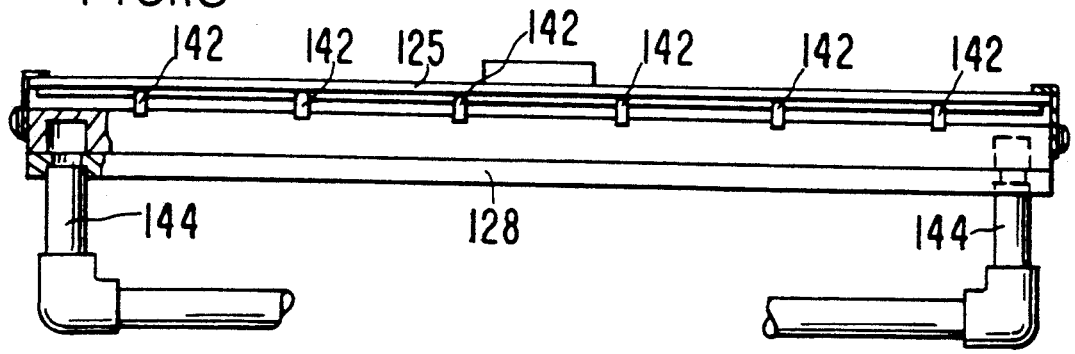
FIG. 13 is a front elevational view of the chill plate assembly for the bottom of the bell jar for cooling the same.

Planar heaters 124 and 125 (FIG. 10) takes the shape of the heater shown in FIG. 12 with the heater having a plurality of parallel segments which are in the same plane, the segments being denoted by the numeral 124a in FIG. 12 and the segments being coupled together at their ends to form a single segment of a predetermined length and secured to terminals 140 and 141 to which electrical power is supplied for energizing the heaters. Quartz standoff ribs 142 are provided to keep the segments of the heaters out of physical contact with adjacent structure, such as the chill plate 128 adjacent to heater 125 (FIG. 10), the standoff quartz members 142 being shown in FIG. 13 as being engageable with the upper surface of the chill plate 128.

Figure 14:
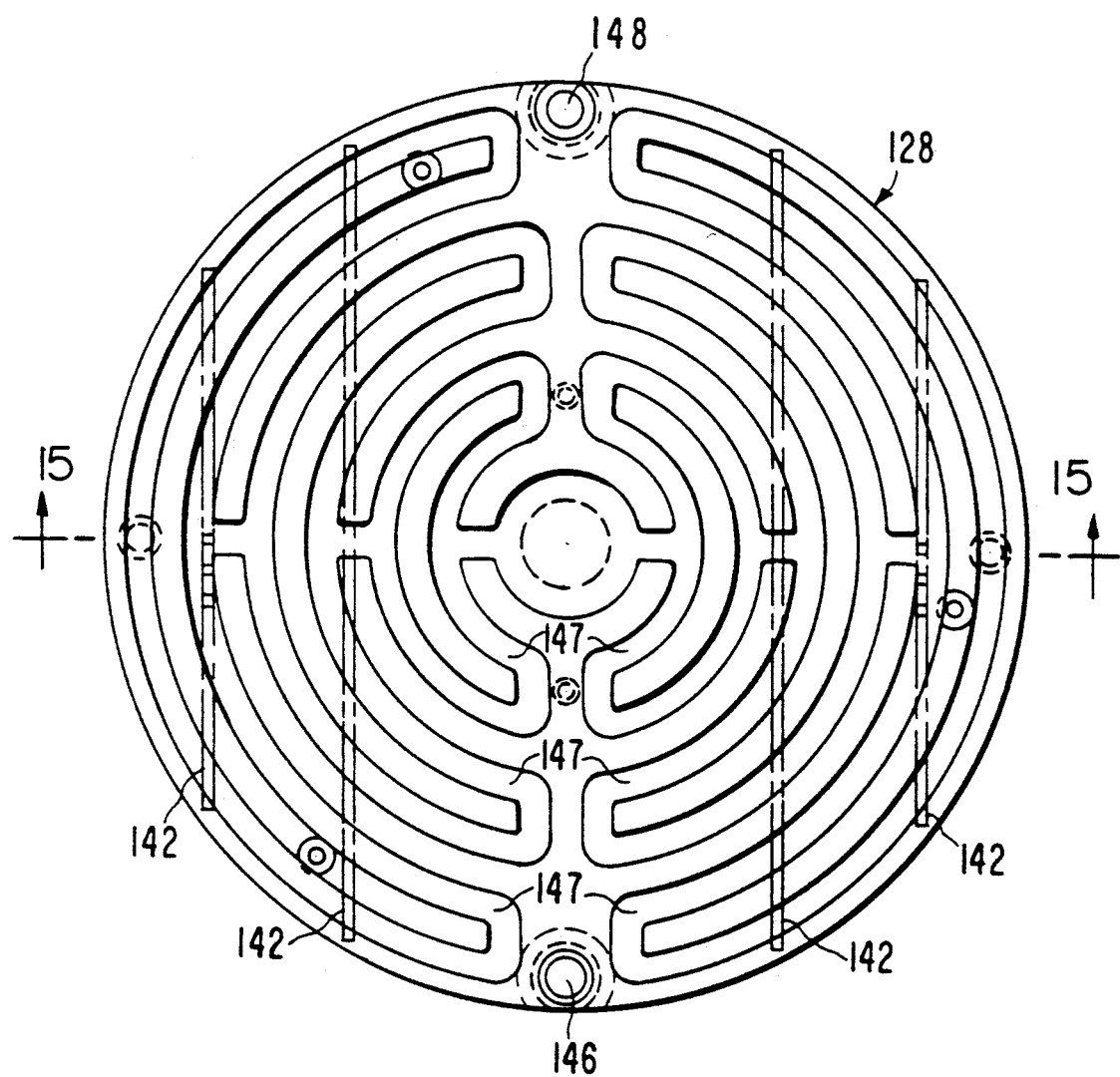
FIG. 14 is a bottom plan view of the fluid passages of the chill plate near the upper end of the bell jar.
Figure 15:
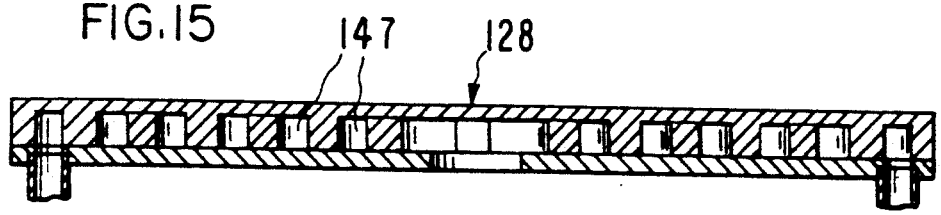
FIG. 15 is a cross-sectional view taken along line 15—15 of FIG. 14.

Fluid lines 144 are provided to supply coolant to chill plates 128 which are tubular as shown in FIG. 14 for receiving coolant at one end 146 and the coolant flows through the various passages denoted by numerals 147 and out of the outlet 148 back to a reservoir for further chilling operations before it returns to the chill plates. The quartz standoff members are also shown in FIG. 14 and the fluid passages 147 are shown in the chill blades 128 of FIG. 15.

Figure 16:
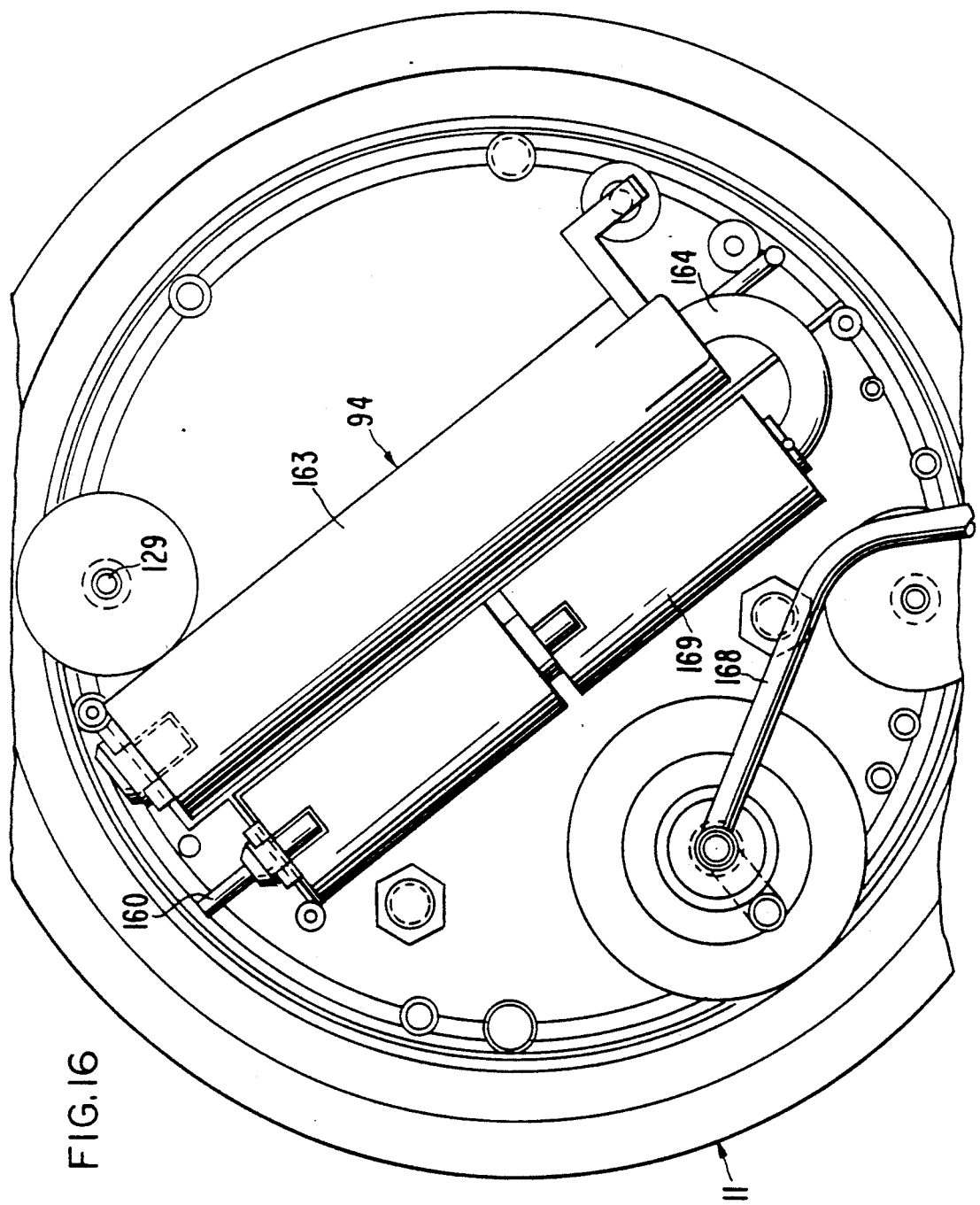
FIG. 16 is a top plan view of the steam generator on the bell jar forming the process chamber of the present invention.
Figure 17:
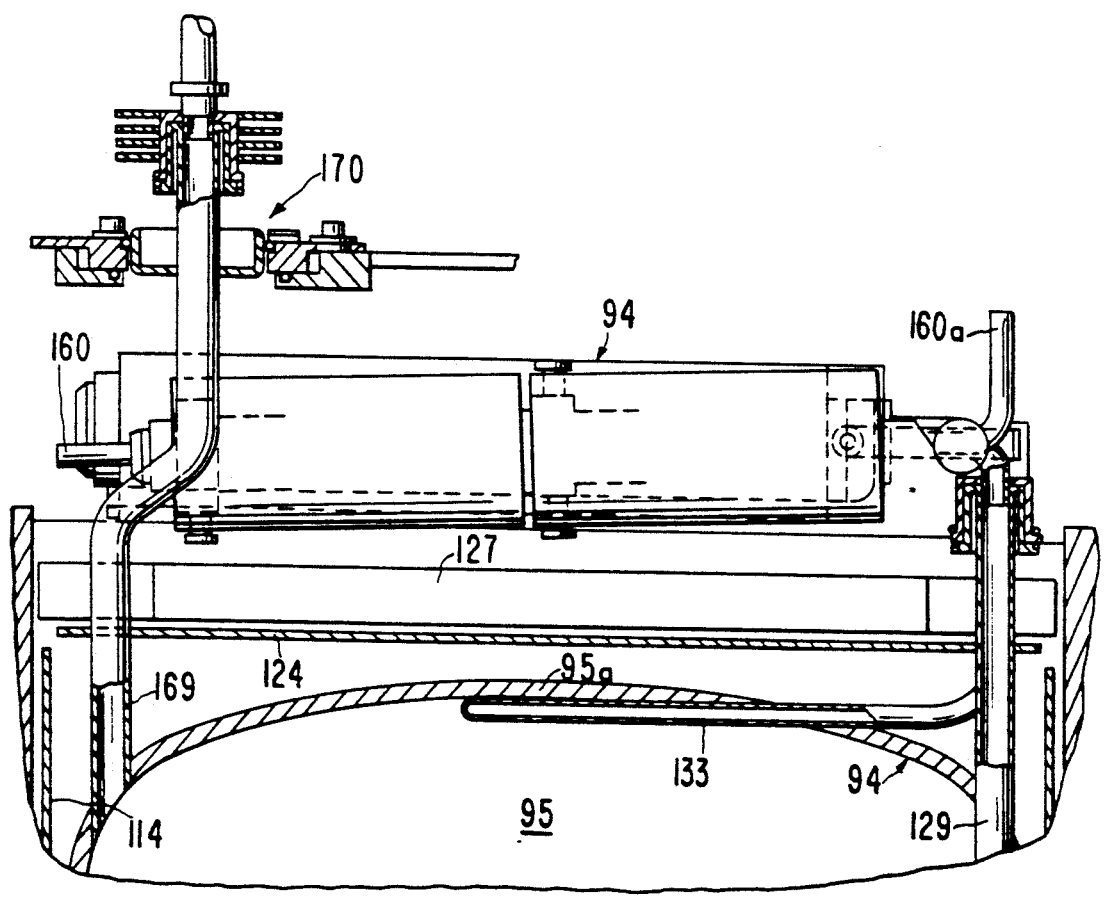
FIG. 17 is a side elevational view of the steam generator of FIG. 16.
Figure 17A:
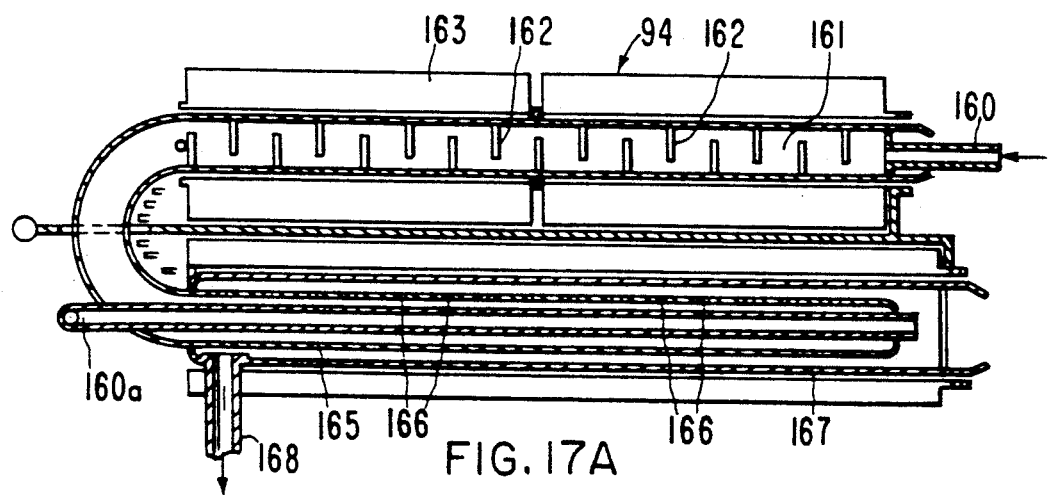
FIG. 17A is a vertical section through the steam generator of FIGS. 16 and 17.

Steam generator 94 is shown in FIGS. 16, 17 and 17A. The steam generator is adjacent to and above the upper or top 95a of the bell jar 95. The steam generator 94 includes an inlet tube 160 (FIG. 16) for receiving deionized water entering the steam generator and movable through a passage 161 (FIG. 17A) past baffles 162 which define a serpentine path for the deionized water. If oxygen is the oxidant, it is input at tube 160a (FIGS. 17 and 17A). Heater means 163 surrounds passage 161 and superheats the deionized water to form steam at a first pressure. This steam continues around passage 164 and into a tube 165 which has openings 166 therethrough communicating with an outer tube 167 surrounded by heater means 169 for superheating the steam to a second temperature and pressure. The outer tube 167 is coupled to a steam outlet 168 which is connected to line 129 (FIG. 10) where the superheated steam passes into the bell jar and enters the bell jar at exit opening 131 (FIG. 18). The steam exits from the bell jar along line 169 (FIG. 17) and equalization means 170 can be provided to equalize the pressure of the steam in the bell jar with the nitrogen on the exterior of the bell jar. In this way, thin walled quartz bell jars can be used in the present invention.

OPERATION

Apparatus 10 is first prepared for operation by directing cassettes 16 of semiconductor wafers 18 into compartment 12 (FIGS. 1-5), the wafers to be subjected to steam and high pressure steam or oxygen, or mixtures of steam and oxygen for processing the wafer.

The wafers 18 from a cassette 16 are transferred by xyz means 32 into a quartz tower 45 of the type shown in FIG. 18 and the tower is lifted by handle 44 onto closure 56 which carries bottom 115 (FIG. 18) of the bell jar.

The tower 45 containing a stack of semiconductor wafers 18 to be processed is then moved on to closure 56 when the same is lowered in the position thereof shown in FIG. 8. By actuation of fluid activated device 84, the closure 56 is elevated with the tower 45 thereon and with the bottom 115 of the bell jar supporting the tower as substantially shown in FIG. 18. Closure 56 is moved into the full line position thereof as shown in FIG. 8. Power device 72 (FIG. 6) is then energized to rotate the ring joint 74 relative to closure 56 so that bayonet means 70 will couple and lock the closure 56 to bottom ring 76. When this occurs, the seals are formed (FIGS. 10 and 18) and bell jar closure 56 (FIG. 18) closes the bottom of the bell jar with the tower 45 in the bell jar as shown in FIG. 18.

Quartz seals will be made at O-ring seals 118 and 120 (FIG. 10), and steam from the steam generator 94 is then formed and directed into the interior of the bell jar. Nitrogen under pressure is then directed into pressure vessel 11. The pressure of the nitrogen is at a slight positive pressure relative to the pressure of the steam in the process chamber, and the pressures of the steam and nitrogen are controlled by electronic means so that the pressure of the steam inside the bell jar is slightly less (1%) than the gas pressure of the nitrogen outside the bell jar. Thus, the bell jar wall can be relatively thin without fear of breakage of the bell jar. This feature reduces the cost of the bell jar and simplifies the handling thereof because of the reduced weight. This feature also improves heat conduction.

Typical process operations are Processes 1 and 2 shown in Tables 1 and 2 for a 50 wafer batch as follows:

TABLE 1

PROCESS 1:
10 ATMOSPHERE, 920° C., 4600A

| Step | Time (Min) | Temp °C. | Pressure (Atmos) | Gas |
|---|---|---|---|---|
| Standby | — | 500 | 1 | $N_2$, 10LPM |
| Push/Lock | 3.0 | 500 | 1 | $N_2 + 1\% O_2$ |
| Temp Ramp | 17.0 | 500–920 | 1 | $N_2 + 1\% O_2$ |
| Steam Purge | 5.0 | 920 | 1 | $H_2O$, 8 cc/min |
| Pressures Ramp | 5.0 | 920 | 1 → 10 | $H_2O$, 8 cc/min |
| Oxidation | 14.0 | 920 | 10 | $H_2O$, 8 cc/min |
| Depress | 5.0 | 920 | 10 → 1 | None |
| Anneal | 20.0 | 920 | 1 | $N_2$ |
| Temp Ramp | 17.0 | 920–500 | 1 | $N_2$ |
| Unload | 3.0 | 500 | 1 | $N_2$ |
| Tower Transfer | | | | |

TOTAL PROCESS TIME = 90 MINUTES

TABLE 2

PROCESS 2:
10 ATMOSPHERE, 850° C., 1500A

| Step | Time (Min) | Temp °C. | Pressure (Atmos) | Gas |
|---|---|---|---|---|
| Standby | — | 500 | 1 | $N_2$, 10LPM |
| Push/Lock | 3.0 | 500 | 1 | $N_2 + 1\% O_2$ |
| Temp Ramp | 14.0 | 500–850 | 1 | $N_2 + 1\% O_2$ |
| Steam Purge | 5.0 | 850 | 1 | $H_2O$, 8 cc/min |
| Pressures Ramp | 5.0 | 850 | 1 → 10 | $H_2O$, 8 cc/min |
| Oxidation | 7.0 | 850 | 10 | $H_2O$, 8 cc/min |
| Depress | 5.0 | 850 | 10 → 1 | None |
| Anneal | 20.0 | 850 | 1 | $N_2$ |
| Temp Ramp | 14.0 | 850–500 | 1 | $N_2$ |
| Unload | 3.0 | 500 | 1 | $N_2$ |
| Tower Transfer | | | | |

TOTAL PROCESS TIME = 80 MINUTES

Once the process is complete, both the steam and nitrogen are exhausted to the atmosphere through the steam outlet and the gas outlets shown in FIG. 9B. No significant pressure differential across the quartz walls of bell jar 95 is generated during this cycle so that no breakage is experienced.

The entire steam generator is high purity material, such as quartz, to prevent contamination of the interior of the process chamber of the bell jar to thereby avoid contamination of wafers in the process chamber 95. The construction of the steam generator is such as to prevent water drops from entering process chamber 95.

The heaters for the steam generator are of high purity material, such as graphite, and provide for minimal metal contamination to the quartz material of the steam generator.

The process chamber heaters are unique in heating process chamber 95 in that the entire chamber area is heated at a specific operating temperature. There is also rapid heat up due to high power graphite heaters and there is rapid cool down due to close proximity of the chill plate and a small thermal mass of the body of the bell jar. The heaters are of high impurity graphite to provide for no metallic contamination of the entire pressure vessel 11 or bell jar 94. The design of the bell jar is suitable for broad pressure ratings including a vacuum through 100 atmospheres.

The process chamber of the present invention has a low thermal mass so as to provide fast response time in carrying out the processes achievable with use of the process chamber. There is no metallic contamination associated with the process chamber and the heaters surrounding the process chamber are graphite heaters, thus adding to the no metallic contamination feature of the present invention. There are no ceramic members or fiber insulators, and the minimal particle generators are used throughout the system.

The process chamber is designed for a 60-wafer tower includes 50 process wafers and a number of guard and test wafers. A separate steam generator is provided for the process chamber and the semiconductor wafers are heated and cooled inside the process chamber itself. The wafers are surrounded by heaters having no cold ends. Greater temperature control is achieved with the heaters of the present invention. There is minimal convection of the heat from the heaters and better oxide uniformity is achieved with such heaters. There is also minimal white power deposits.

There is optimum contamination control with the system of the present invention. To this end, the heaters are high purity graphite with no ceramic insulation, no vestibule blocks, no quartz wool, and no Kanthal (heavy metal source). The heaters are completely isolated from the wafers.

The steam generator is external to the process chamber so as to provide no contamination to the interior of the process chamber. Cold surfaces are eliminated to avoid silica deposits.

The wafers are in the process chamber during temperature ramp up and ramp down. Generally, the process carried out by the method and apparatus of the present invention is a low temperature process, such as in the range of 600° C. to 700° C. with reasonable throughput, and minimal diffusion of implanted species. The laminar flow achievable with the system of the present invention reduces particle contamination of the wafers. Another process which can be carried out with the system of the present invention is the reflow process.

The laminar flow in the apparatus of the present invention is horizontal flow and the wafers are all horizontal in the compartment exteriorly of the process chamber and within the process chamber. All laminar flow in the compartment is directed into the mouth of each wafer cassette. There is no oblique flow at the corners of the cassettes. Any potential particle generator is individually exhausted and all mechanisms are downstream of the wafers in the compartment.

What is claimed is:

1. Apparatus for processing semiconductor wafers comprising:

a pressure vessel;

a hollow body within the pressure vessel and having a process chamber, said pressure vessel and said body having respective lower openings for receiving a plurality of semiconductor wafers as the wafers move as a unit from a location below the pressure vessel to a location within the process chamber;

actuatable means coupled with and vertically shiftable relative to the pressure vessel for closing the lower openings;

means coupled with the body for directing an oxidant at high pressure into the process chamber;

means for directing an inert gas under pressure into the pressure vessel;

means for heating the oxidant in the process chamber;

means for cooling the body after the wafers in the process chamber has been processed; and means coupled with the pressure vessel and the body for equilibrating pressures of the inert gas and the oxidant and for substantially isolating the inert gas from the oxidant.

2. Apparatus as set forth in claim 1, wherein said body is bell jar-shaped and formed of an inert material.

3. Apparatus as set forth in claim 1, wherein said means for directing an oxidant into the process chamber includes a steam generator having a fluid inlet, and a source of deionized water coupled to the inlet of the steam generator.

4. Apparatus as set forth in claim 3, wherein the steam generator includes a tube having a fluid inlet and baffle means for forming a serpentine path for fluid flow through the tube.

5. Apparatus as set forth in claim 4, wherein said tube and the baffle means are formed of an inert material.

6. Apparatus as set forth in claim 4, wherein is included a heater surrounding the tube for heating deionized water flowing through the tube.

7. Apparatus as set forth in claim 4, wherein said steam generator includes a second tube coupled to the first tube, and a third tube surrounding the second tube, there being holes in the second tube for placing the second and third tubes in fluid communication with each other, there being a heater surrounding the third tube.

8. Apparatus as set forth in claim 7, wherein the holes are in the upper extremity of the second tube.

9. Apparatus as set forth in claim 7, wherein the third tube is provided with means for placing the third tube in fluid communication with the process chamber.

10. Apparatus as set forth in claim 7, wherein the second and third tubes are formed of an inert material.

11. Apparatus as set forth in claim 1, wherein said oxidant heating means includes a heater within the pressure vessel and in proximity to and outside said body for heating the interior of the process chamber.

12. Apparatus as set forth in claim 11, wherein said heater means includes a pair of planar heaters above and below the body.

13. Apparatus as set forth in claim 12, wherein said body has an upper wall and a lower wall, said planar heaters being adjacent to respective upper and lower walls.

14. Apparatus as set forth in claim 1, wherein said cooling means includes a chill plate adjacent to the body.

15. Apparatus as set forth in claim 12, wherein said body includes an upper wall and a lower wall, said cooling means includes an upper chill plate and a lower chill plate near respective upper and lower walls, and means coupling the chill plates to a source of coolant.

16. Apparatus as set forth in claim 1, wherein said equilibrating and isolating means includes electronic circuitry and valve means for controlling steam and gas flow to the body and pressure vessel, respectively.

17. Apparatus as set forth in claim 16, wherein is included seal means between the closing means and the body for sealing the junction therebetween when said closing means is actuated.

18. Apparatus as set forth in claim 1, wherein said closing means includes a pair of closure members within the pressure vessel and movable upwardly into closing relationship to the lower openings of the pressure vessel and the body, respectively, and means for moving the closure members vertically into and out of the operative positions thereof.

19. Apparatus as set forth in claim 16, wherein said means for moving the closure members includes a fluid-actuated power device below the pressure vessel.

20. Apparatus as set forth in claim 1, wherein is included a steam generator in the pressure vessel, said generator being operable to pressurize the process chamber to a pressure of at least 100 atmospheres, and means for supplying the inert gas to the interior of the pressure vessel at a pressure of at least 100 atmospheres.

21. Apparatus as set forth in claim 1, wherein is included means for heating the steam in the process chamber to a temperature in the range of 600° C. to 1100° C.

22. Apparatus as set forth in claim 19 wherein said temperature is 600° C. to 1100° C.

23. Apparatus as set forth in claim 1, wherein said heating means includes a number of graphite heaters.

24. Apparatus as set forth in claim 1, wherein said heating means includes means for ramping the temperature upwardly in the process chamber, said cooling means including means for ramping the cooling of the body downwardly, said heating means and cooling means being operable to heat the wafers and for cooling the wafers when the wafers are in the process chamber.

25. Apparatus as set forth in claim 1, wherein is included air flow means for directing an air flow along a horizontal path, said wafers initially being in cassettes in horizontal positions in the cassettes, said cassettes being near the upstream end of the air flow means to minimize or substantially eliminate particle contamination.

* * * * *